United States Patent [19]

Hartsough

[11] 4,420,385

[45] Dec. 13, 1983

[54] APPARATUS AND PROCESS FOR SPUTTER DEPOSITION OF REACTED THIN FILMS

[75] Inventor: Larry D. Hartsough, Berkeley, Calif.

[73] Assignee: Gryphon Products, Hayward, Calif.

[21] Appl. No.: 485,556

[22] Filed: Apr. 15, 1983

[51] Int. Cl.$^3$ .............................................. C23C 15/00
[52] U.S. Cl. .................................. 204/192 R; 204/298
[58] Field of Search ............................ 204/192 R, 298

[56] References Cited

U.S. PATENT DOCUMENTS

| | | | |
|---|---|---|---|
| 3,620,956 | 11/1971 | Gauger | 204/192 R |
| 3,773,639 | 11/1973 | Masotti . | |
| 3,822,200 | 7/1974 | Tsunehiko Endo . | |
| 3,890,217 | 6/1975 | Burrows et al. . | |
| 3,892,650 | 7/1975 | Cuomo et al. . | |
| 3,957,608 | 5/1976 | Streel | 204/298 |
| 3,962,062 | 6/1976 | Ingrey . | |
| 3,985,635 | 10/1976 | Adam et al. . | |
| 4,046,659 | 9/1977 | Cormia et al. | 204/192 R |
| 4,060,471 | 11/1977 | Pinch et al. . | |
| 4,124,474 | 11/1978 | Bomchil et al. . | |
| 4,128,466 | 12/1978 | Harding et al. . | |
| 4,132,624 | 1/1979 | King et al. | 204/192 R |
| 4,166,784 | 9/1979 | Chapin et al. . | |
| 4,204,942 | 5/1980 | Chahroudi | 204/192 R |
| 4,234,622 | 11/1980 | Dubuske et al. | 204/192 R |
| 4,309,261 | 1/1982 | Harding et al. | 204/192 R |
| 4,381,965 | 5/1983 | Maher et al. | 204/298 |

OTHER PUBLICATIONS

R. S. Nowicki, "Properties of RF-Sputtered Al$_2$O$_3$ Films Deposited by Planar Magnetron".
S. Schiller, "Reactive DC Sputtering With the Magnetron/Plasmatron for Tantalum Pentoxide and Titanium Dioxide Films".
M. Bujor, et al., "A Study of the Initial Oxidation of Evaporated Thi Films of Aluminum by AES, ELS, and ESD".
S. Maniv, et al., "High Rate Deposition of Transparent Conducting Films by Modified Reactive Planar Magnetron Sputtering of Cd$_2$Sn alloy".

Primary Examiner—Arthur P. Demers
Attorney, Agent, or Firm—John K. Williamson; Robert J. Fox

[57] ABSTRACT

A method and apparatus for forming a thin film on a substrate by sputtering of a material from a cathode, which material is subsequently reacted to form the thin film. A process chamber has a sputter zone which contains a sputter electrode assembly and in which an inert sputtering atmosphere is injected. Isolation means separates the sputtering zone from a reaction zone of the process chamber, into which a chemically reactive atmosphere is injected, and prevents the chemically reactive atmosphere from entering the sputtering zone. A substrate receives a sputtered material in the sputtering zone, and is subsequently transferred to the reaction zone where the sputtered material is contacted by and reacts with the chemically reactive atmosphere therein to form a reacted thin film.

12 Claims, 5 Drawing Figures

APPARATUS AND PROCESS FOR SPUTTER DEPOSITION OF REACTED THIN FILMS

BACKGROUND OF THE INVENTION

It has been recognized that it is desirable to apply aluminum oxide to thin film magnetic heads as a wear resistant coating by sputtering the dielectric onto the wafer. In the past, a sputtered aluminum oxide coating was usually applied by either radio frequency sputtering of aluminum oxide from a target composed of aluminum oxide or direct current reactive sputtering of aluminum from a metallic aluminum target through a sputtering atmosphere comprised of either pure oxygen or a mixture of oxygen and argon.

Both of these prior art processes, however, suffer from several drawbacks. Rates of deposition of coatings from a dielectric target such as aluminum oxide, are usually quite low. In addition the substrate or wafer receiving the coating usually becomes very warm. The prior art method of radio frequency magnetron deposition from an aluminum oxide target of aluminum oxide films at deposition rates exceeding 300 Angstroms per minute often yields substrate temperatures in excess of 300° C. Electrons also bombard the substrate causing undesirable reactions in or damage to the film or underlying layers of the substrate. Another prior art process employs radio frequency sputtering of a metal target. However, in that process the cathode can become oxidized which reduces the rate of sputter deposition.

The prior art deposition of aluminum oxide from an aluminum oxide target usually employed pure argon as the sputtering gas. The dielectric films deposited through the pure argon are often deficient in oxygen and exhibit lower abrasion resistance and lower breakdown voltages than anticipated. When attempts are made to increase the electrical resistivity and the breakdown voltage of the deposited thin film by adding oxygen to the sputtering argon gas, the deposition rate from the aluminum oxide target is reduced to about one half of the deposition rate using pure argon. Furthermore, the deposited films exhibit high defect densities which are attributed to the accumulation of particulate aluminum oxide which flakes off shields and fixtures within the sputtering chamber.

In the alternative prior art process, which employs a metal target and reaction of the sputtered target material with partial pressures of reactive gases such as oxygen to form aluminum oxide, the sputtering apparatus can be operated at higher power densities per unit target area without failure of the target or metal bond since the metal of the target exhibits higher thermal conductivity and greater plasticity than the aluminum oxide targets. Furthermore, although it is necessary to employ a radio frequency sputtering apparatus for deposition from a dielectric target, a DC magnetron cathode can be employed to sputter conductive metal. The anode of the DC magnetron cathode can be arranged to collect free electrons in the sputtering chamber, thereby preventing the electrons from striking the substrate and damaging it. However, one of the drawbacks of this process is that the reactive gas, usually oxygen, also reacts with the clean metal surface of the sputtering target, causing a decrease in the sputtering rate from the target and considerable arcing and variations in load impedance. Since the prior art reactive sputtering process is often controlled by measuring electrical characteristics, such as target voltage or current, changes in the electrical characteristics of the target due to a buildup of a dielectric film, as a result of chemical reaction with oxygen gas in the chamber, perturb the control process and prevent the formation of a uniform dielectric film from run to run.

What is needed then is a process which will allow sputtering of a material from a metallic target but at the same time insure that the thin film deposited on the substrate is a high quality dielectric. It is also important that the process is repeatable and easily controlled.

SUMMARY OF THE INVENTION

The present invention is directed to a process and an apparatus for depositing dielectric materials and in particular aluminum oxide. A multiple pass sputtering apparatus has a movable holder positioned within a process chamber. The movable holder carries a plurality of substrates under a metallic target which forms a portion of a sputtering cathode also positioned within the process chamber. A pumping plenum or shield means substantially surrounds the metallic target and extends into proximity with a portion of the movable holder to define a sputtering zone within the process chamber. An inert gas is flowed into the sputtering zone adjacent the target. Metallic aluminum is sputtered from the metallic target and deposited onto the substrate in the conventional fashion.

While the aluminum is being sputtered onto the substrate, the movable holder eventually carries the substrate into a reaction zone of the process chamber which is effectively isolated from the target and the inert gas in the sputtering zone by the pumping plenum or shield means. A reactive gas is flowed into the reaction zone and reacts with the freshly deposited metal film on the substrate to form a dielectric thin film. The substrate is then carried back into the sputtering zone by the movable holder where another layer of material is sputtered onto it. The second metal layer is then converted to a second dielectric layer when the substrate is carried into the reaction zone. In this manner, successive layers of metal are deposited and reacted until the desired thickness of dielectric is obtained.

It is a principal object of the present invention to provide an apparatus and a process for the deposition of dielectric thin films whereby a sputtering zone is isolated from a reaction zone.

It is another object of the instant invention to provide a sputter deposition process whereby dielectrics may be deposited but the target is composed of only one component of the dielectric and remains substantially pure throughout its useful life.

It is still another object of the present invention to provide a method of depositing dielectric thin films whereby a high rate of deposition is achieved without overheating the substrate.

Other objects of the present invention will become obvious to one skilled in the art upon a perusal of the following specification and claims in light of the accompanying drawings.

BRIEF DESCRIPTION OF THE DRAWINGS

For a better understanding of the present invention reference may be made to the accompanying drawings in which.

DESCRIPTION OF THE PREFERRED EMBODIMENTS

Figure 1:
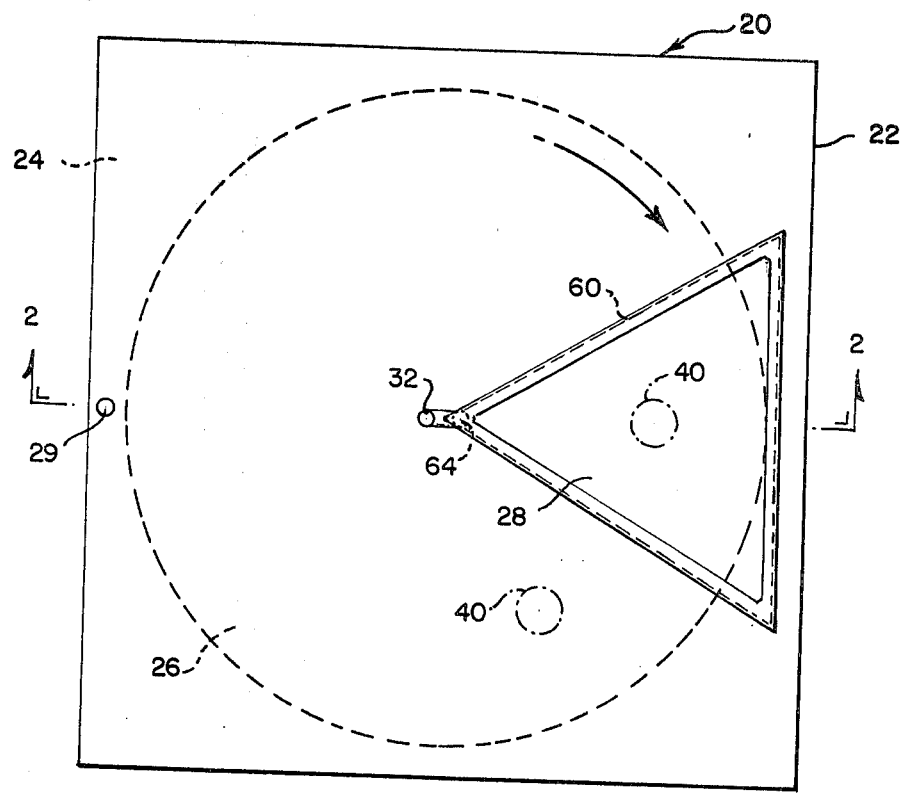
FIG. 1 is a plan view of a portion of a sputtering apparatus embodying the present invention, which shows details of the relationship between a triangular cathode assembly, a shield and a rotatable table.
Figure 2:
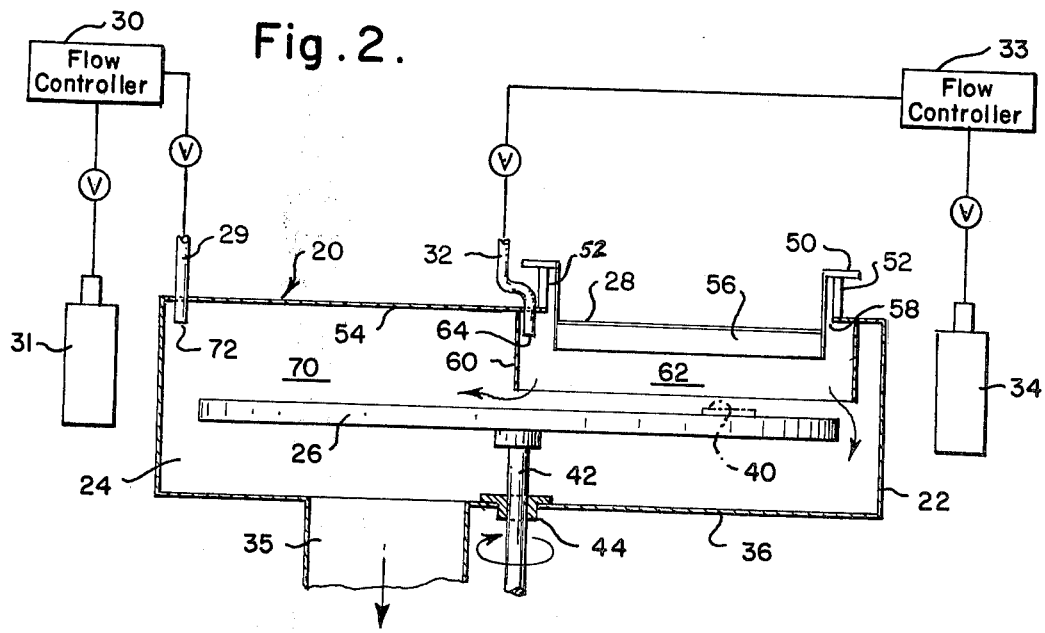
FIG. 2 is a sectional view, taken along line 2—2 of FIG. 1, showing details of the relationship between a target of the cathode assembly, the rotatable table, a sputtering zone and a reaction zone.

Referring to the drawings, there is shown in FIGS. 1 and 2 a sputtering apparatus, designated generally by reference numeral 20. The sputtering apparatus 20 includes a gas tight enclosure 22 which defines a process chamber 24. A substantially circular rotatable substrate carrying table 26 is centrally located in the process chamber 24 and is positioned under a cathode assembly 28 to receive sputtered metal therefrom. An inlet 29 for a reactive gas, in the present embodiment oxygen, communicates with the interior of enclosure 22. The inlet 29 is connected to a flow controller 30 which receives oxygen from a source 31. In a similar fashion, an inlet 32 for an inert gas, in the present embodiment argon, also communicates with the process chamber 24. The inlet 32 is connected to a flow controller 33 which receives a sputtering gas, in the present embodiment argon, from a source 34.

As may best be seen in FIG. 2, the process chamber 24 communicates with a vacuum pump, not shown in FIG. 2, through a pumping conduit 35 which is connected to a bottom wall 36 of the gas tight enclosure 22. The pumping conduit 35 and the vacuum pump are employed to reduce the gas pressure in the process chamber 24 to a pressure appropriate for sputtering.

The rotatable substrate table 26 carries one or more substrates 40 and is itself supported by a column 42 which is journaled in a gas tight bearing 44. The bearing 44 is supported on the floor 36 of the gas tight enclosure 22. A suitable motive power source is drivingly connected to the column 42 in order to rotate the table 26.

The cathode assembly 28 provides a source of metal atoms which are sputtered onto the substrates 40. It includes a cathode 50 which is supported by an annular insulator 52, connected to a top wall 54 of the gas tight enclosure 22. The cathode assembly 28 also includes a metallic target 56, which in the instant embodiment is composed of substantially pure aluminum. The target 56 is attached to the cathode 50 and protrudes through an opening 58 in the top wall 54 to face the rotatable table 26. While this is the preferred arrangement, it is noted that the relative orientation of target 56 and substrates 40 can be varied in a manner known in the art.

A shield 60, having in preferred forms substantially the same shape as the target 56, surrounds the target 56 and extends downward and into proximity with a portion of the rotatable table 26. The shield 60, the cathode 28 and the portion of the rotatable table 26 beneath the shield 60 together define a sputtering zone 62 which is filled with substantially pure argon gas from an injector 64 of the argon inlet 32. It should be appreciated that the shield 60 separates the sputtering zone 62 and its argon atmosphere from other portions of the process chamber 24.

When the cathode 50 is energized, accelerated argon ions impinging on the target 56 transfer their momentum to the aluminum atoms of the target 56. The aluminum atoms then travel in substantially straight lines from the target 56 to strike the substrates 40 and condense thereon. Since in the present embodiment the target is composed of aluminum, the atoms condensing on the substrate comprise metallic aluminum which does not react chemically with the argon sputtering atmosphere provided through the argon injector 64 and preserved in substantially pure form by the shield 60. However, as the rotatable tabe 26 continuously turns, it sweeps the substrates 40 out from under the target 56 into a portion of the process chamber 24 which lies outside the shield 60. That portion comprises a reaction zone 70 which is filled with an oxygen enriched atmosphere supplied from the oxygen source 31 through an oxygen injector 72 which extends into the reaction zone 70. In preferred forms, the total gas pressure in the sputtering zone 62 is maintained somewhat higher than the total gas pressure in the reaction zone 70 and the vacuum conduit 35 communicates directly with the reaction zone 70, such that gas flow from the reaction zone 70 to the sputtering zone 62 is precluded. Consequently, the argon atmosphere in the sputtering zone 62 is isolated from the reaction zone 70 and is not contaminated by the reactive oxygen atmosphere. The oxygen or reactive atmosphere reacts with the freshly sputtered aluminum on the substrate 40 to produce aluminum oxide which is a dielectric. The oxidation takes place rapidly and is completed before the substrates are swept back into the sputtering zone 62 by motion of the rotatable table 26.

When the substrates 40 are carried back into the sputtering zone 62 under the target 56, deposition on the substrates 40 with another layer of aluminum metal commences. The metal layer or film is subsequently oxidized when the substrate is again swept into the reaction zone 70. In the instant embodiment a thin film of approximately three monolayers of aluminum, is sputtered onto the substrates 40 during each pass under the target 56; this corresponds to a thickness of approximately 7.5 Angstroms. The steps of repeated sputtering of pure metal through the inert argon atmosphere followed by reaction in a substantially pure reactive gas atmosphere are repeated until the dielectric aluminum oxide film on the substrate 40 reaches a desired thickness.

Figure 3:
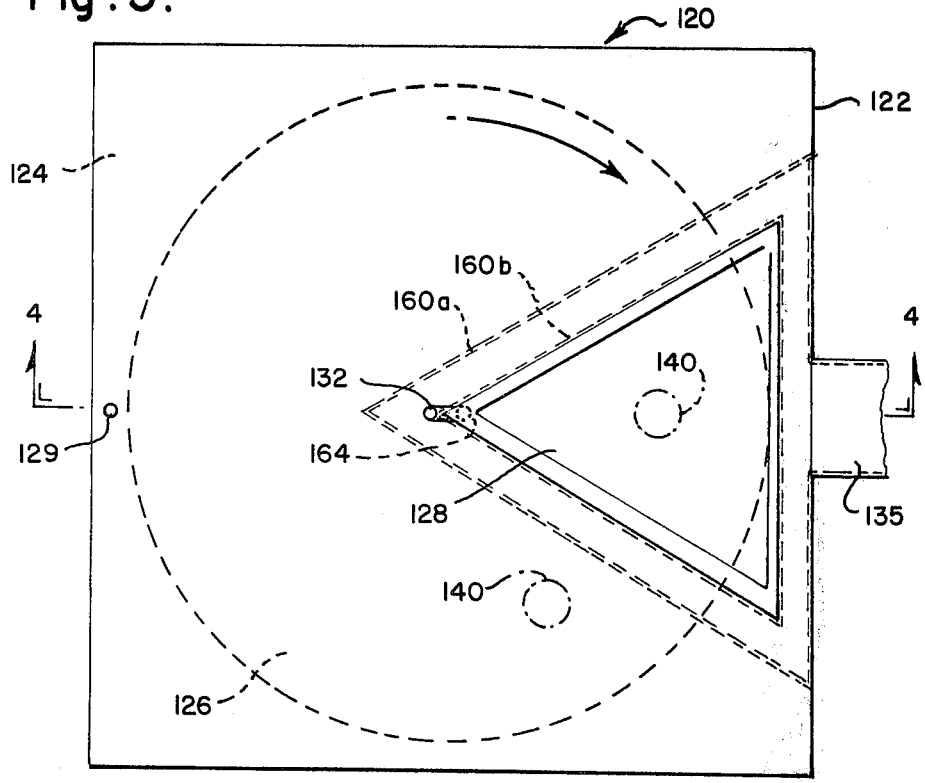
FIG. 3 is a plan view of a portion of a sputtering apparatus which comprises an alternative embodiment of the instant invention, showing details of a triangular cathode assembly and its relationship to a pumping plenum.
Figure 4:
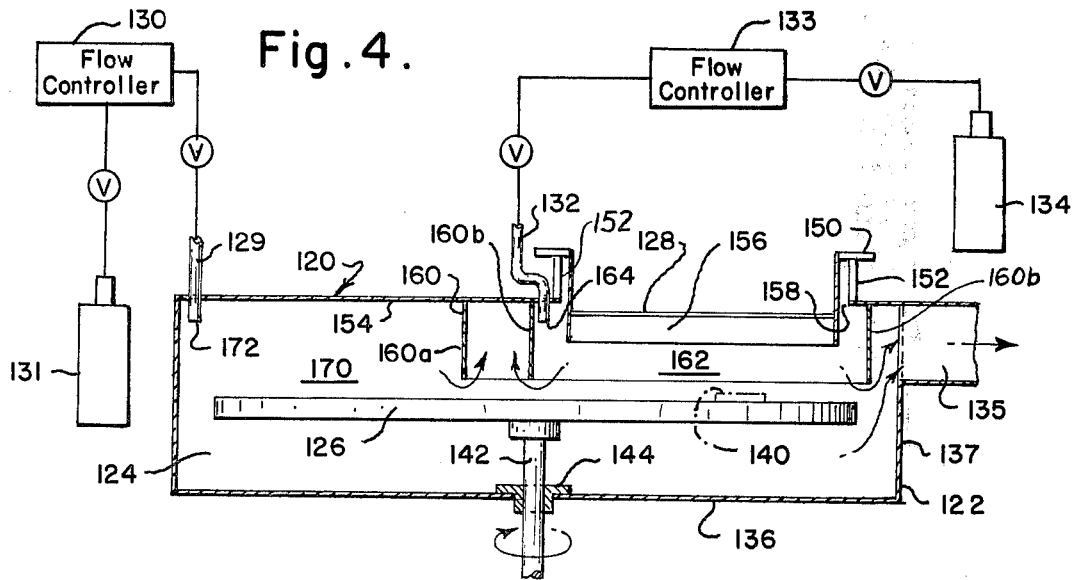
FIG. 4 is a sectional view, taken along line 4—4 of FIG. 3 showing details of the relationship between a target of the triangular cathode assembly, the pumping plenum, a rotatable table for carrying substrates, a sputtering zone and a reaction zone.

Referring now to FIGS. 3 and 4, an alternative embodiment of the instant invention is disclosed therein. FIG. 3 discloses a sputtering apparatus, designated generally by reference numeral 120. The sputtering apparatus 120 includes a gas tight enclosure 122 which defines a process chamber 124. A substantially circular rotatable substrate carrying table 126 is centrally located in the process chamber 124 and is positioned under a cathode assembly 128 to receive sputtered metal therefrom.

An inlet 129 for a reactive gas, in the present embodiment oxygen, communicates with the interior of enclosure 122. The inlet 129 is connected to a flow controller 130 which receives oxygen from a source 131. In a similar fashion, an inlet 132 for an inert gas, in the present embodiment argon, also communicates with the process chamber 124. The inlet 132 is connected to a flow controller 133 which receives argon from a source 134.

As may best be seen in FIG. 4, the process chamber 124 communicates with a vacuum pump, not shown in FIG. 4, through a pumping conduit 135 which is connected to a side wall 137 of the gas tight enclosure 122. The pumping conduit 135 and the vacuum pump are employed to reduce the gas pressure in the process chamber 124 to a pressure appropriate for sputtering.

The rotatable substrate table 126 carries one or more substrates 140 and is itself supported by a column 142 which is journaled in a gas tight bearing 144. The bearing 144 is supported on a floor 136 of the gas tight enclosure 122. A suitable motive power source is drivingly connected to a column 142 in order to rotate the table 126.

The cathode assembly 128 provides a source of metal atoms which are sputtered onto the substrates 140. It includes a cathode 150 which is supported by an annular insulator 152, connected to top wall 154 of the gas tight enclosure 122. The cathode assembly 128 also includes a metallic target 156, which in the instant embodiment is composed of substantially pure aluminum. The target 156 is attached to the cathode 150 and protrudes through an opening 158 in the top wall 154 to face the rotatable table 126.

A pumping plenum 160, comprised of an exterior wall 160a and an interior wall 160b, having substantially the same shape as the target 156, surrounds the target 156 and extends downward and into proximity with a portion of the rotatable table 126. The pumping plenum 160 is connected to the vacuum conduit 135. The pumping plenum 160, interior wall 160b the cathode assembly 128 and the rotatable table 126 together define a sputtering zone 162 which is filled with pure argon gas from an injector 164 of the argon inlet 132. It should be appreciated that the structure of the pumping plenum 160 isolates the sputtering zone 162 and its pure argon atmosphere from other portions of the process chamber 124.

When the cathode assembly 128 is energized, accelerated argon ions impinging on the target 156 transfer their momentum to the aluminum atoms of the target which then travel in substantially straight lines from the target to strike the substrates 140 and condense thereon. Since in the present embodiment the target is composed of aluminum, the atoms condensing on the substrate comprise metallic aluminum which does not react chemically with the argon sputtering atmosphere provided through the argon injector 164 and preserved in substantially pure form by the pumping plenum 160. However, as the rotatable table 126 continuously turns, it sweeps the substrates 140 out from under the target 156 into a portion of the process chamber 124 which lies outside the pumping plenum 160. That portion comprises a reaction zone 170 which is filled with an oxygen enriched atmosphere supplied from the oxygen source 131 through an oxygen injector 172 which extends into the reaction zone 170. Since the plenum 160 is in direct communication with the vacuum conduit 135, the pressure in the plenum 160 will be less than that in either of the zones 162, 170, and accordingly undesired gas flow between the zones 162, and 170 is precluded. As a consequence, the reactive oxygen atmosphere is effectively isolated from the sputtering zone 162. The oxygen or reactive atmosphere reacts with the fresly sputtered aluminum on the substrate 140 to produce aluminum oxide which is a dielectric. If the metal film thickness is properly chosen oxidation takes place rapidly and is completed before the substrates are swept back into the sputtering zone 162 by the motion of the rotatable table 126.

When the substrates 140 are carried back into the sputtering zone 162 under the target 156, sputtering of the substrates 140 with another layer of aluminum metal commences. The metal layer or film is subsequently oxidized when the substrate is again swept into the reaction zone 170. In the instant embodiment a thin film of aluminum having a thickness of approximately three monolayers is sputtered onto the substrates 140 during each pass under the target 156. The steps of repeated sputtering of pure metal through the inert argon atmosphere followed by reaction in a reactive gas atmosphere are repeated until the dielectric aluminum oxide film on the substrates 140 reaches a desired thickness.

The embodiments described above are designed to take advantage of a phenomenon called initial fast oxidation. It is known that the average number of oxide monolayers formed on a clean aluminum surface at low temperatures during the initial fast oxidation stage is three. This corresponds to a thickness of approximately 11 Angstroms. The kinetics of this stage follow a linear law:

$$X = CPt + C_o,$$

where X is the oxide thickness, P is the pressure of oxygen, t is time and C and $C_o$ are constants. The initial fast oxidation is a result of chemisorption of oxygen on the clean metal surface and the rapid formation of several monolayers of oxide. The process appears to require no activation energy. Kinetic data for initial fast oxidation of aluminum apparently have not been published. However, published data for $TiO_2$, which also forms three monolayers and has about the same bond strength, show that fast oxidation is complete after about 50 Langmuirs of exposure (one Langmuir equals $10^{-6}$ Torr-sec). Even faster oxidation has been observed in the presence of water vapor. Using the case for pure oxygen exposure, it can be calculated that at an $O_2$ partial pressure of $1 \times 10^{-3}$ Torr initial fast oxidation is complete in about 0.05 sec.

Figure 5:
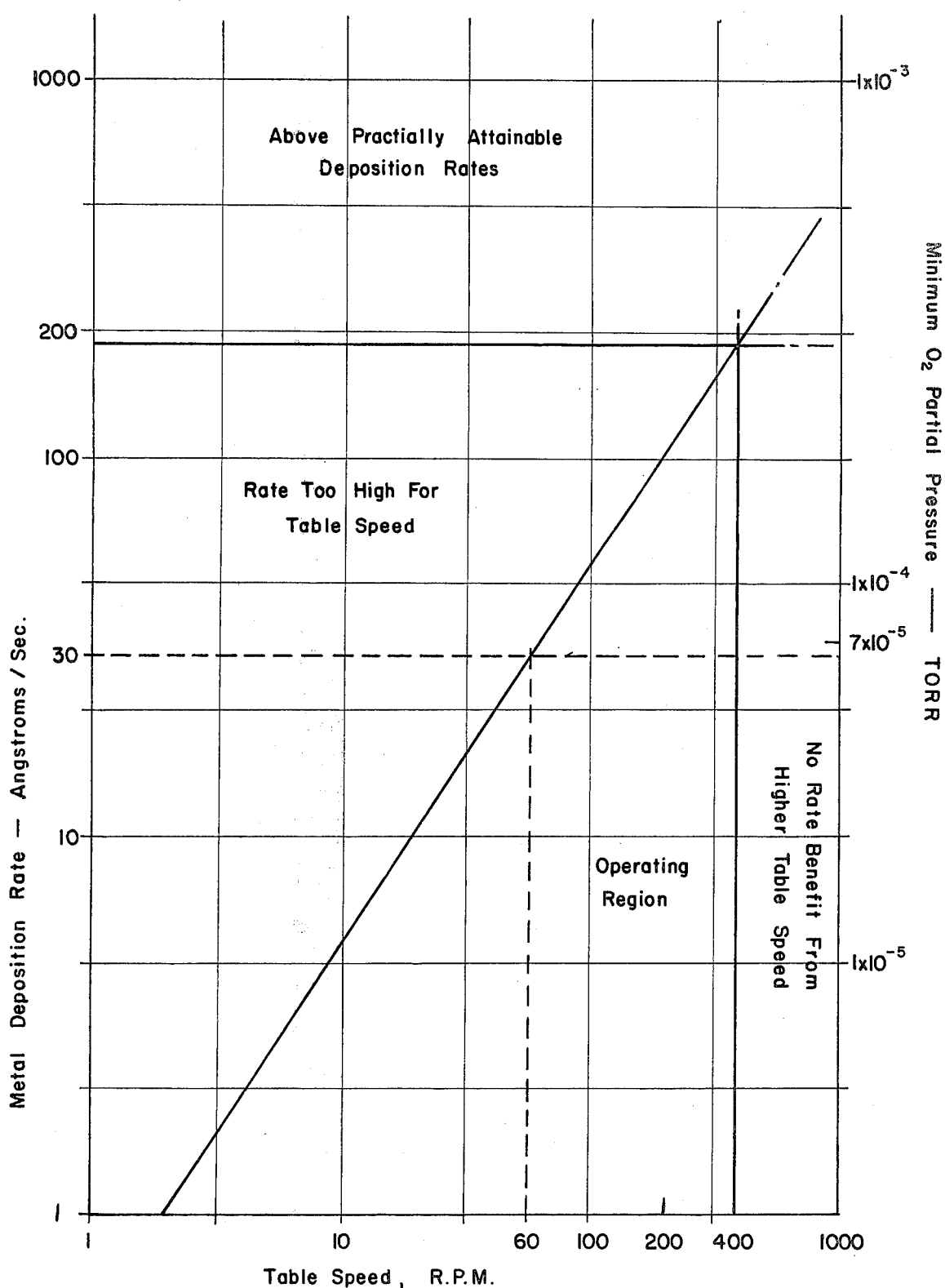
FIG. 5 is a graph showing an acceptable range of values of metal deposition rate and minimum oxygen partial pressure as functions of the rotational speed of the rotatable table to obtain thin films of aluminum oxide with the apparatus and process embodying the present invention.

FIG. 5 was constructed using the following assumptions:

1. Metal is deposited during one quarter turn of the rotatable table.
2. The reaction takes place during three quarters turn of the rotatable table.
3. Fifty Langmuirs exposure to the reactive gas is required to react the metal.
4. The highest attainable rate of metal deposition, using DC magnetron sputtering, is 200 Angstroms per second.
5. Three aluminum oxide layers of 11 Angstroms corresponds to 7.5 Angstroms of metallic aluminum.

By way of illustration, if a metal deposition rate of 30 Angstroms/per sec. is used, the table rotational speed must be at least 60 RPM and the $O_2$ partial pressure must be at least on the order of $7 \times 10^{-5}$ Torr. Higher rotational speeds and oxygen pressures can be used, but build up of the reacted layers does not occur faster unless higher metal deposition rates are used. As it is, 30 Angstrom/sec., metal rate corresponds to an oxide growth rate of 2640 Angstrom/min. This is about one order of magnitude greater than can be obtained by prior art processes.

As previously mentioned, further enhancement of the growth rate, if desired, can be obtained by admitting water vapor to the reaction zone. It is also probable that establishment of a glow discharge in the reaction zone will further enhance the growth rate, since it is well known that the ions and radicals produced are more reactive than molecular oxygen.

The aluminum can be rapidly deposited from the target since relatively high current densities can be obtained in the cathode due to the fact that the target is composed of heat -and electrically- conductive metal. Heating of the substrate is reduced in the preferred forms of the invention since the oxidation step does not occur at the same time as the condensation of the aluminum, thus preventing excessive heat build up which has occurred in devices heretofore available. Use of the DC magnetron cathode reduces substrate heating due to lower electron flux at the substrate.

It may be appreciated then that the instant invention provides a method for rapidly depositing dielectric thin films without any of the drawbacks of the prior art. The dielectric films so deposited exhibit reduced defect densities because there is no aluminum oxide formed on shields and fixtures within the sputtering zone, and consequently, defects caused by the presence of aluminum oxide flakes in the sputtering chamber are eliminated.

While there has been shown and described two embodiments of the present invention, it will be understood that changes and modifications may be made to the claims by those skilled in the art and it is, therefore, intended by the appended claims to cover all such changes as fall within the true spirit and scope of the present invention.

What is claimed is new and desired to be secured by Letters Patent of the United States is:

1. A method of forming a thin reacted film of selected thickness on a substrate, said method comprising the steps of:
   (a) placing said substrate in the process chamber of a sputtering apparatus, said chamber having a sputtering zone and a separate reaction zone;
   (b) providing an inert atmosphere in said sputtering zone and a chemically reactive atmosphere in said reaction zone;
   (c) sputter depositing a layer of first material onto said substrate in said sputtering zone;
   (d) subsequently moving said substrate from said sputtering zone to said reaction zone; (e) retaining said substrate in said reaction zone for a residence time sufficient to convert said layer of first material to a reacted layer of second material; (f) returning said substrate to said sputtering zone; and
   (g) repeating steps (c) through (f) until a desired thickness of reacted film is formed on the substrate.

2. The method of claim 1 wherein said layer of first material is equivalent to n monolayers, where n is a positive number less than 5.

3. The method of claim 2 where said first material is selected from a group comprising aluminum and titanium, and n is approximately 3.

4. The method of claim 3 wherein said reactive atmosphere includes a predetermined partial pressure of oxygen, said residence time in said reactive zone providing about 50 Langmuirs of exposure.

5. The method of claim 1 wherein said reactive atmosphere includes water vapor.

6. Apparatus for sputter deposition of a thin reacted film on a substrate, said apparatus including:
   a process chamber having a sputter zone and a reaction zone;
   movable substrate holder means within said chamber for transferring said substrate between said zones;
   a sputter electrode assembly disposed within said sputter zone for depositing a layer of first material on said substrate when the latter is in the sputter zone;
   means for introducing an inert atmosphere into said sputter zone;
   means for introducing a chemically reactive atmosphere into said reaction zone whereby to convert said first material into a second material when said substrate is in said reaction zone; and
   means for segregating said reactive atmosphere from said sputter zone.

7. Apparatus as claimed in claim 6, wherein said segregating means comprises a shield circumscribing said sputter electrode assembly and means for maintaining the pressure of said inert atmosphere in said sputter zone higher than the pressure of said reactive atmosphere.

8. Apparatus as claimed in claim 7, said holder means comprises a rotatable turntable offset from said electrode assembly, said shield being disposed intermediate said turntable and said electrode assembly, and substantially spanning the spacing therebetween.

9. Apparatus as claimed in claim 6, wherein said segregating means includes a pumping plenum circumscribing said sputter electrode assembly at the periphery of said sputtering zone, said plenum being in fluid communication with both said zones.

10. Apparatus as claimed in claim 9, said segregating means further including vacuum means in direct fluid communication with said plenum for maintaining the pressure therein lower than the pressure of either said reactive atmosphere or said inert atmosphere.

11. A method of forming a thin film on a substrate comprising the steps of: placing a substrate to be coated in a process chamber, reducing the pressure within said process chamber, introducing an inert sputtering atmosphere into a sputtering zone of said process chamber, introducing a chemically reactive atmosphere into a reaction zone of said process chamber, isolating said inert sputtering atmosphere in said sputtering zone from said chemically reactive atmosphere in said reaction zone to prevent intrusion of reactive gas into said sputtering zone, energizing a sputter electrode positioned within said sputter zone to deposit a thin film of first material from said electrode onto said substrate, placing said substrate in said reaction zone, contacting said substrate and said first material deposited on said substrate with said chemically reactive atmosphere to produce a thin reacted film, and repeating said steps of depositing said first material on said substrate and contacting said first material with said chemically reactive atmosphere a sufficient number of times to build up a desired thickness of said thin reacted film on said substrate.

12. An apparatus for reactive sputter deposition of a thin film comprising: a process chamber having a movable substrate holding means located therein, a sputter electrode assembly located in a sputter zone of said process chamber, to deposit a first material on a substrate, means for introducing an inert atmosphere into said sputter zone, a reaction zone located outside said sputter zone, means for introducing a chemically reactive atmosphere into said reaction zone so that said chemically reactive atmosphere can contact said first material deposited on said substrate to convert said first material to a second material, and means for isolating said sputter zone from said reaction zone to prevent mixing of said reactive gas and said inert gas in said sputter zone.

* * * * *